United States Patent [19]

Wissell

[11] Patent Number: 4,751,721
[45] Date of Patent: Jun. 14, 1988

[54] APPARATUS AND METHOD FOR TESTING CONTACT INTERRUPTIONS OF CIRCUIT INTERCONNECTION DEVICES

[75] Inventor: Daniel Wissell, Westford, Mass.

[73] Assignee: Digital Equipment Corporation, Maynard, Mass.

[21] Appl. No.: 13,323

[22] Filed: Feb. 11, 1987

[51] Int. Cl.[4] .................. G01M 19/00; G07C 11/00; G01R 31/04
[52] U.S. Cl. .................................. 377/20; 377/26; 324/73 R; 324/423; 324/538
[58] Field of Search ............................. 377/19, 20, 26; 324/73 R, 423, 537, 538

[56] References Cited

U.S. PATENT DOCUMENTS

| | | | |
|---|---|---|---|
| 4,288,687 | 9/1981 | Zinn | 377/19 |
| 4,301,360 | 11/1981 | Blair | 377/20 |
| 4,380,731 | 4/1983 | Alker | 324/538 |
| 4,517,684 | 5/1985 | Fennel | 377/19 |
| 4,670,891 | 6/1987 | Salowe et al. | 377/26 |
| 4,697,138 | 9/1987 | Morishita et al. | 324/73 R |

*Primary Examiner*—John S. Heyman

*Attorney, Agent, or Firm*—William W. Holloway; Robert C. Mayes; William C. Cray

[57] ABSTRACT

Apparatus and method are disclosed for identifying and measuring random contact interruption events in a circuit interconnection device. A comparator circuit, adapted to be operated at high frequencies, identifies when an interrupt event has occurred. The comparator circuit, as a result of the interruption event, causes a high frequency counter circuit to count clock pulses. The count in the counter circuit is continuously applied to an RAM memory circuit, write-enabled at an addressed memory location. After the interruption event is terminated, the RAM memory circuit is no longer write enabled at the addressed location and the addressed location is changed (incremented) in preparation for the next event. The counter circuit is also reset to zero in preparation for the next interruption event. The number of counts from a clock unit having a known frequency provides the duration of the interruption event. With the use of a clock unit operated at 100 MHz, interrupt events from 10 nanoseconds to 9.99 microseconds can be identified. Because of the frequency at which the testing is performed, the input impedance of the comparator circuit must be matched to the impedance of the circuit interconnection device.

20 Claims, 2 Drawing Sheets

APPARATUS AND METHOD FOR TESTING CONTACT INTERRUPTIONS OF CIRCUIT INTERCONNECTION DEVICES

BACKGROUND OF THE INVENTION

1. Field of the Invention

This invention relates generally to the testing of electronic and, logic circuits and more particularly, to the testing of devices used for circuit interconnections.

2. Description of the Related Art

In order to provide the interconnection between portions of electronic and logic systems, the recent trend has been to use standardized connectors. While the standardization of the system connectors has provided decreased cost, the diversity of potential applications has resulted in the degradation of performance in some of the applications. For example, the connectors can be involved in distribution of power in the system, in the coupling of components implemented in transistor to transistor logic (TTL), in distribution of signals in communication networks, etc. It will be clear that each type of connector can have different characteristics (e.g., impedance characteristics) depending on the application of the connector. Similarly, different applications can impose different requirements for contact interrupts of the connectors. A one millisecond interrupt in a power distribution system can, because of the signal filtering, be unimportant to the system, while a similar interrupt in transmission of TTL signals can have important circuit implications.

The contacts in the interconnect apparatus have interrupt events that can occur during the test and qualification phases or during the actual operation of the system. One class of contact interruption events occurs when a contact is tested for a duration greater than one hundred hours. The contact system is subject to change over this period of time because of relatively slow changes in the electrical properties. This class of change in the contact system can best be characterized by a change in the direct current (DC) resistance of the interconnection device and the DC resistance parameter can be readily measured, including measurement by automated systems.

A second class of contact interruption events is caused by mechanical shock and vibration. The contact interrupts detected during testing for this class of events appear to be random with respect to a time coordinate. These interrupt events can be correlated to an external stimulus such as a particular frequency imposed during vibrational contact system testing. The duration of the contact interrupt events in the second class is found to be dependent on such factors as the mechanical construction of the contact system and the amount and frequency of the vibrational energy applied to the interconnection system during the test. The durations of contact interruptions encountered during this type of testing procedure can range from 15 to 20 nanoseconds (ns) to several milliseconds (ms).

FEATURES OF THE INVENTION

It is an object of the present invention to provide an improved system for testing electronic apparatus.

It is a feature of the present invention to provide a system for testing contact interruptions in a connnector component.

It is another feature of the present invention to measure the number of contact interruption events during a test period.

It is another feature of the present invention to provide a measurement of the duration of a contact interrupt event.

It is a still further feature of the present invention to be able to measure the duration of a contact interrupt event within ±5 nanoseconds.

SUMMARY OF THE INVENTION

The aforementioned and other features are obtained, according to the present invention, by providing a comparator circuit, capable of operating at high frequencies, to identify an interruption event in a connection component. The comparator circuit can be adjusted to control the sensitivity of the interruption event identification. The comparator circuit, upon identification of an interruption event, enables a counter circuit to count the number of clock pulses from a clock unit. The contents of the counter circuit are continuously applied to a write-enabled addressed location in a RAM memory unit. At the conclusion of the interrupt event, the counter circuit is disabled, the addressed location in the RAM unit is no longer write-enabled and a new RAM unit location is addressed. As a result of the completion of the interruption event, the counter circuit is reset to a zero value for the next identified interruption event. Tri-state buffer switches permit the counter signals stored in the RAM unit to be controllably removed from the RAM unit. The contents of each RAM unit location provide measurements of the duration of each interruption event. Provision is also made for associating external data signal groups with the event duration information. Because of the high frequencies involved in the testing and measuring procedures, the input impedance of the comparator circuit is matched to the impedance of the connection component.

These and other features of the present invention will be understood upon reading of the following description along with the drawings.

DESCRIPTION OF THE PREFERRED EMBODIMENT

Detailed Description of the Figures

Figure 1:
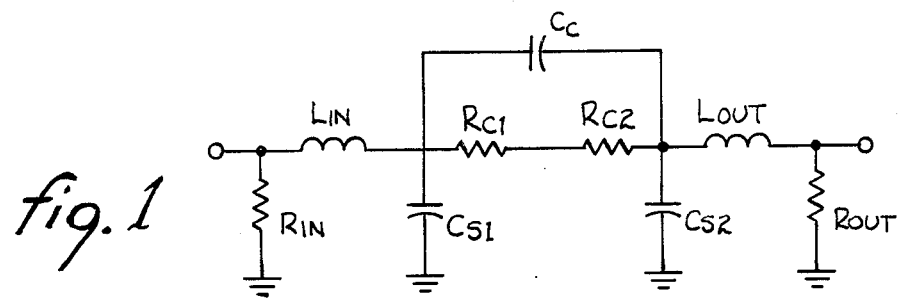
FIG. 1 is a circuit diagram of a simple model of an equivalent circuit of a connector component.

Referring first to FIG. 1, a model equivalent circuit of the connector component describing the component behavior for high speed interrupt phenomena is shown. The inductance of the component is represented by an input inductance, $L_{IN}$ and an output inductance, $L_{OUT}$. This inductance has its origin in the structure of the component and does not include contributions from sources external to the component. The steady state resistance of the connector component includes both the bulk resistance and the interface resistance between the coupled or mated contacts. The resistance is denoted by $R_{C1}$ and $R_{C2}$ in FIG. 1. The distributed capacitance of the connector component is designated as $C_{S1}$ and $C_{S2}$. The resistors $R_{IN}$ and $R_{OUT}$ are terminating resistors which match the input and output impedances, respectively, for the connector component. The capacitor $C_C$ is the result of an assumed capacitance formed by the physical proximity of the contact system when the actual contacts are mechanically separated, either by extreme force or by non-conductive extraneous material such as dust, oxides, etc. on the contact surface. The value of capacitor $C_C$ is a function of the design of the connector, the separation of the contacts and the type of dielectric formed during an impact. This capacitance is assumed to exist only during the instant of the high speed interrupt. This model was verified using Type N connectors. The model can also be used to verify the test results in the high speed interrupt test system and provides an explanation as to why multiple contacts cannot be connected in series combinations on controlled impedance connectors without the use of matched impedance transmission lines.

Figure 2:
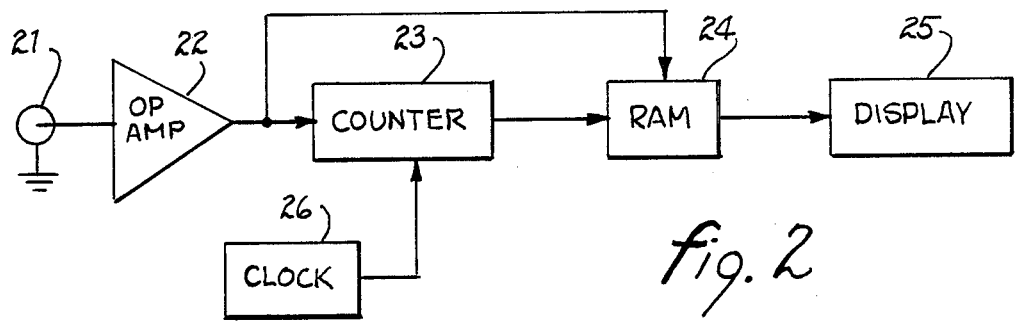
FIG. 2 is a functional block diagram of the high speed contact interrupt detector and measurement circuit of the present invention.

Referring next to FIG. 2, the functional block diagram of the apparatus for testing a connector component for interrupt events is shown. The signal from connector 21 is applied to an input terminal of an operational amplifier 22. The output signal of the operational amplifier 22 is applied to counter 23 and random access memory (RAM) 24. The counter 23 has a signal from clock 26 applied thereto, the clock signal serving as a time base. The signals stored in the RAM unit 24 are used to drive a display unit 25.

Figure 3:
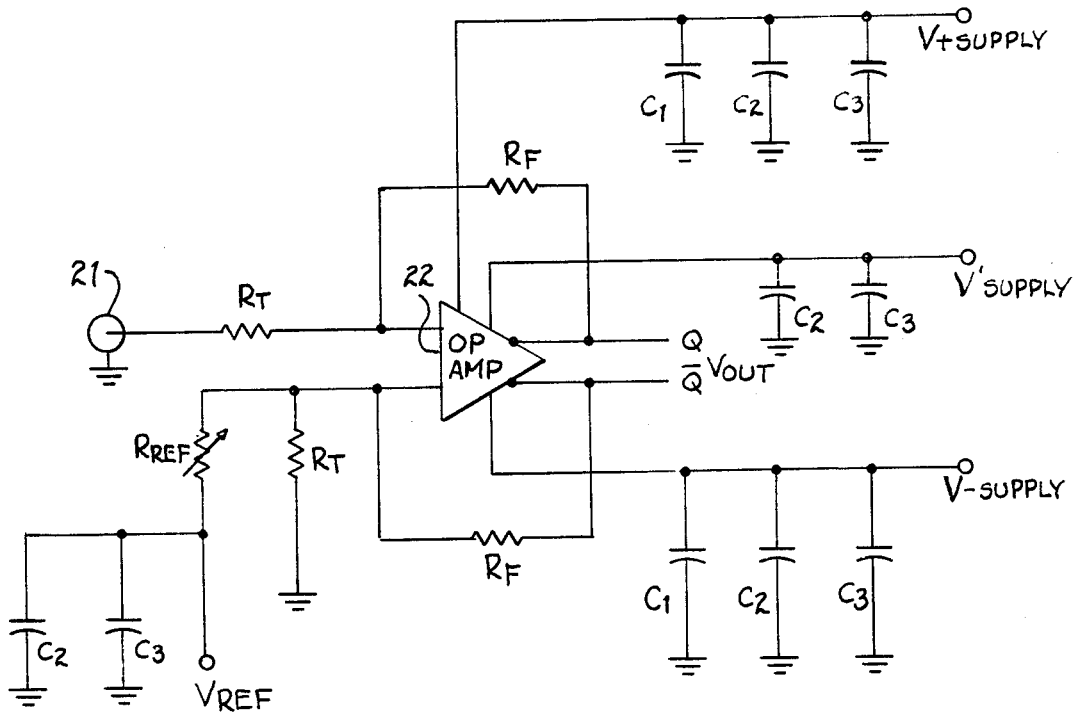
FIG. 3 is a circuit diagram of the input detector or comparator component of the detector circuit according to the present invention.

Referring next to FIG. 3, the configuration of the operational amplifier 22 is shown. In the preferred embodiment, the operational amplifier is an ultra-high speed analog voltage comparator, e.g., a Signetics NE529 device. The voltage from connector 21 is applied through $R_T$ to a first input terminal of the operational amplifier 22. The first terminal of the operational amplifier 22 is coupled through resistor $R_F$ to the output terminal Q. The second input terminal of operational amplifier 22 is coupled through resistor $R_T$ to the common potential, through resistor $R_F$ to the inverted output terminal Q and through variable resistor $R_{REF}$ to the voltage supply $V_{REF}$. The voltage supply $V_{REF}$ is coupled through capacitors $C_2$ and $C_3$, coupled in parallel, to the common potential. One supply terminal of operational amplifier 22 is coupled to the voltage supply $V_{+SUPPLY}$ and through capacitors $C_1$, $C_2$ and $C_3$, all coupled in parallel to the common potential. A second supply terminal of operational amplifier 22 is coupled to $V'_{SUPPLY}$ and though capacitors $C_2$ and $C_3$, coupled in parallel, to the common potential. A negative supply terminal of operational amplifier 22 is coupled to voltage supply $V_{-SUPPLY}$ and through capacitors $C_1$, $C_2$ and $C_3$, all coupled in parallel, to the common potential. In the preferred embodiment, $V_{SUPPLY} = 10$ volts, $V_{-SUPPLY} = -10$ volts, $V''_{SUPPLY} = 5$ volts, $V_{REF} = 1.5$ volts, $C_1 = 1000$ pf, $C_2 = 0.1$ uf and $C_3 = 1$ uf.

Figure 4:
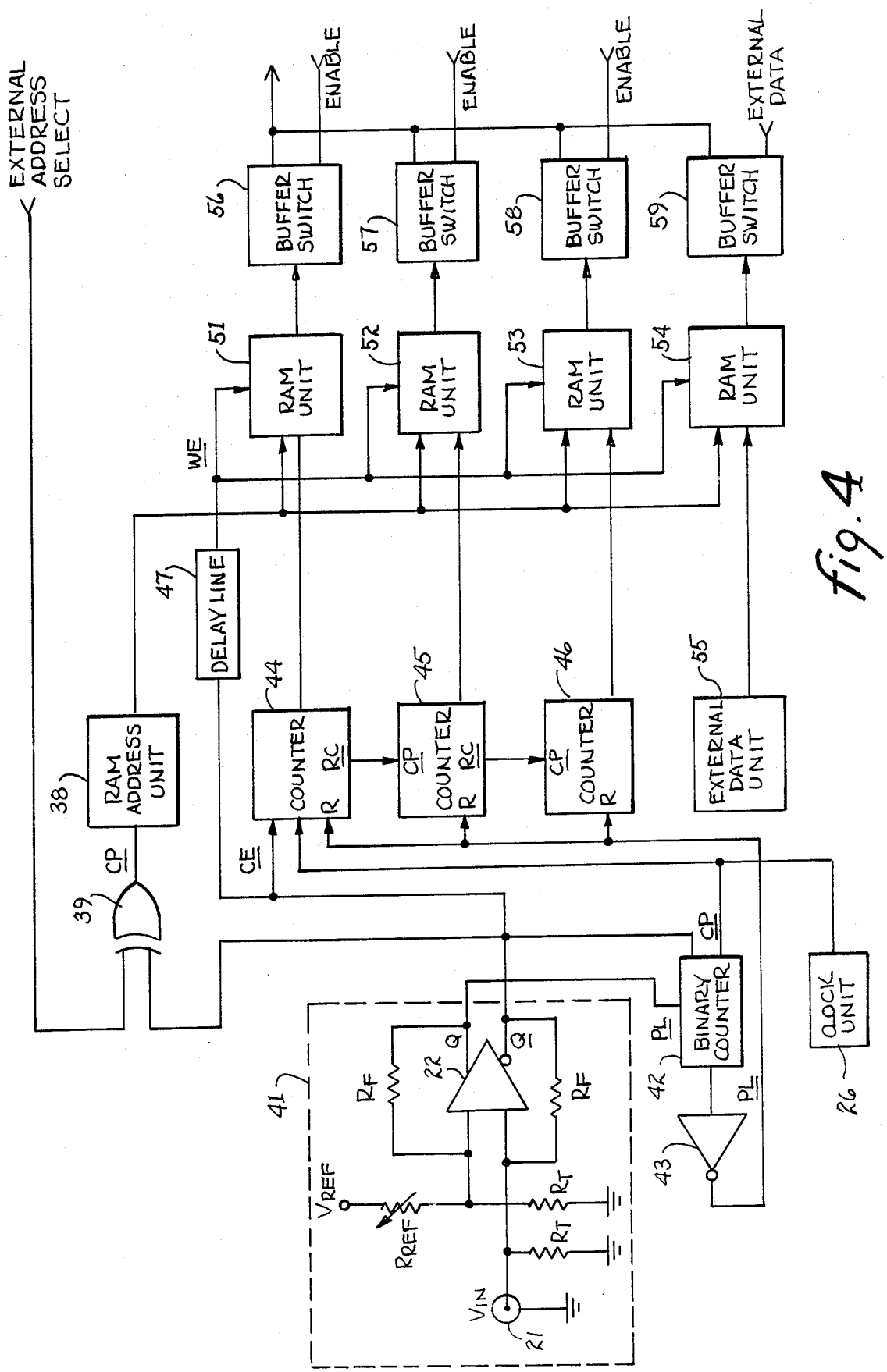
FIG. 4 is a block diagram of the components implementing a contact interrupt detection and measurement system of FIG. 2 according to the present invention is shown.

Referring now to FIG. 4, the implementation of the interrupt detector and measurement circuit of FIG. 2 is shown. The portion of the detector circuit labelled 41 includes the operational amplifier and associated components of FIG. 3 with some of the biasing components omitted. The Q terminal of operational amplifier 22 is coupled to binary counter 42. The output signal of binary counter 42 is applied to an input terminal of inverting amplifier 43, while the output signal of inverting amplifier 43 is applied to reset terminals of counter 44, counter 45 and counter 46 via the PARALLEL LOAD (PL) line. The inverted output terminal (Q) of operational amplifier 22 is coupled to delay line 47, to an input terminal of exclusive-or (XOR) logic unit 39, to a disable terminal of binary counter 42 and to an enable terminal of counter 44. Clock unit 26 applies signals to binary counter 42, and to an input terminal of counter 44. The overflow signal from counter 44 is applied to counter 45, and an overflow signal from counter 45 is applied to counter 46. EXTERNAL ADDRESS SELECT signals are applied to input terminals of XOR logic gate 39, while output signals from XOR logic gate 39 are applied to RAM address unit 38. Output signals from RAM address unit 38 are applied to address terminals of RAM units 51, 52, 53 and 54. A WRITE ENABLE signal from delay line 47 is applied to enable terminals of RAM units 51, 52, 53 and 54. Output signals from counters 44, 45, and 46 are applied to input terminals of RAM units 51, 52 and 53, respectively. Output signals from RAM units 51, 52 and 53 are applied to input terminals of buffer switch units 56, 57 and 58, respectively. RAM unit 54 receives input signals from external data unit 55 and applies signals to buffer switch 59. The buffer switches 56, 57, 58 and 59 have enable signals applied thereto.

OPERATION OF THE PREFERRED EMBODIMENT

The high speed contact interruption detection and measurement circuit has been designed to detect an interrupt event, measure the duration of the event and store this information for purposes of analyzing of the interconnect system. The major difficulty in designing a testing system for an interrupt event is the randomness of the events in time, and this randomness sets a limit on the number of events that can be detected and measured in a given period of time. The random nature of the events increases the difficulty associated with enabling and disabling the circuits timing the event. The operational amplifier 22, when the signal $V_{IN}$ remains above a selectable voltage value applied to the second input terminal, i.e., determined by $V_{REF}$, $R_{REF}$ and $R_T$, the binary counter 42 is enabled and after 4 clock signals from clock unit 26, sets the counters 44, 45, 46 and 47 to a zero internal value. When the signal $V_{IN}$ falls below the selectable voltage value i.e., as a result of a contact interruption event for the interconnection device under test, then the output signal from the inverted (Q) output terminal of operational amplifier 22 changes state, disables binary counter 42 while setting the internal value to zero and enables counter 44. By enabling counter 44, the counter 44 thereafter begins counting the clock pulses from clock unit 26. The change in state of the operational amplifier 22 also causes the RAM memory units 51–54 to be enabled after a delay determined by delay line 47. The counters 44–46 will count the number of clock pulses while the operational amplifier inverted output signal terminal is in the new state. Because the clock unit 26 is delivering clock pulses at a predetermined rate, the counter designates the time that the operational amplifier inverted signal terminal is in the new state. When the contact interruption ends, the signal at the inverting terminal of operational amplifier returns to the original state, causing the counters to stop incrementing. After a delay determined by delay line 47, the RAM memory units are prevented from storing signals therein. The delay line ensures that any data in the counters has been stored in the RAM memory units before the RAM memory units are disabled. The return to the original state causes RAM address unit 38 to increment, so that the count during a next interrupt event will be placed in a new RAM memory unit location. The binary counter 42 is once again enabled and zeros are entered in the counters 44-46.

To permit access to the data signals now stored in the RAM memory units, the buffer switches 56-59 can be enabled. These buffer units are tri-state inverting circuits. These buffer switches permit the data in the RAM memory units to removed on a single bus. The RAM unit 54 is present for user supplied information, i.e., test temperature, vibrational frequency, that can be used to identify the data.

The XOR logic gate 39 provides either manual control of the RAM address unit 39 or permits automatic control of the addressing function, e.g., by a microprocessor unit. As will be clear, the number of events for which data can be accumulated depends of the number of locations in the RAM units 51-53. In the preferred embodiment, the clock unit can have a 100 MHz output frequency. An interrupt duration of 10 nanoseconds to 9.99 microseconds can be measured with the present invention.

As is well known, in order to respond to an event having a duration of T, a circuit must have a frequency response F that is proportional to 1/T. The circuit must therefore be able to respond to signal frequencies of approximately 100 MHz. At this elevated signal frequency, the techniques of radio frequency communication must be employed. In particular, the input impedance of the circuit including the operational amplifier should be equal to the output impedance of the connector device or $R_T = Z_{CON}$, i.e., the impedance of the connector device being tested. It will be clear that the connector impedance can have a large variation from connector device to connector device. Therefore, to maximize testing procedures, $R_T$ will be determined by the connector device under test.

In order to prevent "chatter" when the interrupt event causes the voltage signal to cross the detection threshold, hysteresis can be added to the input signal in the following manner. The amount of hysteresis is determined by resistances $R_T$ and $R_F$ from the following equation:

$$V_{HYS} = [V_{OUT} * R_T]/[R_T + R_F]$$

where in FIG. 2 $V_{OUT} = 5$ VDC; $R_T = Z_{CON}$ and $R_F$ = the feedback resistor. Solving for $R_F$:

$$R_F = \{[(V_{OUT} * R_T)/V_{HYS}] - R_T\}$$

In this manner, an appropriate amount of hysteresis can be added to minimize the "chatter" phenomenon. Of course, if the impedance matching resistors $R_T$ are changed in order to test a different connector device, then the value of the feedback resistor $R_F$ must be recalculated.

The operational amplifier 22 can have a high internal gain (approximately 5000 for the Signetics NE529 device). Therefor, a one millivolt input signal will result in the full 5 volt signal change in the output voltage of the operational amplifier. Because of the high frequency response of the operational amplifier, as well as the ability to differentiate between signals of a few millivolts, care is required in the physical layout of the operational amplifier and associated circuits. Ground planes must be used to avoid spurious signals from being applied to the input of the operational amplifier. The output signals of the operational amplifier must be well isolated from the input signals. The stray capacitance of the operational amplifier must be kept to a minimum. As shown in FIG. 3 and described in connection therewith, extensive filtering of the power supply leads and of the reference voltage leads is required to minimize extraneous signals. Any path that will allow even a few millivolts of signal to be applied from the output terminal to the input terminal can result in oscillation of the operational amplifier circuit.

The ability to measure the duration of a contact interrupt event is important to distinguish these events from noise induced events. The noise induced events are random, as are the contact interrupt events. In addition, in the test environment, the sensitivity is frequently set to the maximum level, thereby increasing the probability of noise induced event detection. However, the noise induced events are typically of very short duration and an event duration measurement can assist in separating noise induced events from contact interruption events.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by spirit and scope of the invention.

What is claimed is:

1. A circuit for measuring contact interrupt events in a circuit interconnection device comprising:
   comparator circuit means for comparing a signal from said interconnection device with a reference signal, said comparator circuit means providing a first and a second signal in response to said interconnection device signal and said reference signal comparison;
   a clock unit providing clock pulses of a known frequency;
   counter means for counting said clock pulses in response to said first signal, said counter means being reset in response to said second signal;
   memory means coupled to said counter means for storing count signals determined by said counter means at a predetermined address; and
   address means for determining which memory location receives said count signals, said address means addressing a new memory means location in response to said second signal.

2. The circuit for measuring contact interrupt event of claim 1 wherein an initiation of an interrupt event causes said comparator circuit means to generate said first signal, a termination of said interrupt event causing said comparator circuit means to generate said second signal, said stored count signal measuring a duration of said interrupt event.

3. The circuit for measuring contact interrupt events of claim 2 wherein said clock pulse frequency is greater than 20 MHz.

4. The circuit for measuring contact interrupt events of claim 2 wherein said circuit can measure a duration of an interrupt event to within +5 nanoseconds.

5. The circuit for measuring contact interrupt events of claim 2 wherein said memory means further includes a second memory location associated with each predetermined address, said second location providing information signal groups related to said count signals stored at said predetermined address.

6. The circuit for measuring contact interrupt events of claim 2 wherein said counter means includes a first clock signal counter means and a second clock signal counter means, said first clock signal counter means counting said clock pulses in response to said first signal, said second counter means responsive to said second signal for counting said clock pulses, said second counter means resetting said first clock signal counter means after a predetermined number of clock pulse counts.

7. The circuit for measuring contact interrupt events of claim 2 wherein said second signal enables said memory means for receiving signals from said counter means, said circuit further including delay means for delaying application of said second signal to said memory means.

8. The circuit for measuring contact interrupt events of claim 7 further comprising tri-state buffer switch means coupled to said memory means, said tri-state buffer means controlling transfer of said stored count signal from said memory means.

9. The circuit for measuring contact interrupt events of claim 7 wherein said comparator circuit means includes a differential amplifier, an input impedance of said differential amplifier being determined by an impedance of said circuit interconnection device.

10. The method of measuring durations of random contact interruption events in an interconnection device comprising the steps of:
   addressing a selected memory location of a memory unit;
   generating a first signal by an event detection circuit when said contact interruption event is detected;
   counting pulses from a clock unit in a counter unit in response to said first signal;
   applying pulse count signals from said counter unit to a memory unit;
   enabling storage of said pulse count signals in said memory unit in response to said first signal;
   disabling said counter unit from counting said clock pulses when said first signal is removed;
   disabling said memory unit in response to said first signal removal;
   addressing a next memory location in response to said first signal removal; and
   resetting said counter unit to an initial value in response to said first signal removal.

11. The method of measuring contact interruption events of claim 10 further comprising the step of transferring said pulse count signals to a display unit.

12. The method of measuring contact interruption events of claim 11 further comprising the step of implementing said clock unit with apparatus for providing 100 MHz clock pulses.

13. The method of measuring contact interruption events of claim 10 further comprising the step of storing information signal groups associated with said contact interruption events in a memory location associated with said selected memory location.

14. The method of measuring contact interruption events of claim 10 further comprising the step of matching an input impedance of said event detection circuit with an impedance of said interconnection device.

15. Apparatus for measuring durations of random contact interruption events of an interconnection device comprising:
   adjustable reference signal means;
   differential amplifier means having a first input terminal coupled to said interconnection device and a second input terminal coupled to said reference signal means, said differential amplifier having a first signal terminal and a second signal terminal;
   clock means for providing a sequence of clock pulse signals having a predetermined frequency;
   counter means having said clock pulse signals applied thereto, said counter means coupled to said second signal terminal for enabling counting of said clock pulse signals in response to a predetermined signal from said second signal terminal;
   memory means coupled to said counter means and to said second signal terminal for storing count signals from said counter means at a selected memory unit location in response to said predetermined signal from said second signal terminal: and
   address means coupled to said memory unit for determining said selected memory unit location, said address means responsive to a change in said predetermined signal for determining a different selected memory means location.

16. The apparatus for measuring contact interruption events of claim 15 futher including delay means for delaying application and removal of said predetermined signal to and from said memory means.

17. The apparatus for measuring contact interruption events of claim 16 further including a resistor coupled to said first input terminal, said resistor matching an impedance of said interconnection device.

18. The apparatus for measuring contact interruption events of claim 17 further comprising a second memory means for associating information signal groups with each location in said memory means.

19. The apparatus for measuring contact interruption events of claim 17 further including a second counter means coupled to said clock means and to said first and second signal terminals for providing a reset signal to said counter means after a pre-established period of time after disabling of said counter means.

20. The apparatus for measuring contact interruption events of claim 19 further comprising buffer switch means coupled to said memory means for controllably transferring said stored count signals from said memory means.

* * * * *